US006625433B1

(12) United States Patent
Poirier et al.

(10) Patent No.: US 6,625,433 B1
(45) Date of Patent: Sep. 23, 2003

(54) CONSTANT COMPRESSION AUTOMATIC GAIN CONTROL CIRCUIT

(75) Inventors: John R. Poirier, Gilbertsville, PA (US); Christopher J. Strobel, Barto, PA (US)

(73) Assignee: Agere Systems Inc., Allentown, PA (US)

( * ) Notice: Subject to any disclaimer, the term of this patent is extended or adjusted under 35 U.S.C. 154(b) by 469 days.

(21) Appl. No.: 09/677,008

(22) Filed: Sep. 29, 2000

(51) Int. Cl.$^7$ ................................................. H04B 1/06
(52) U.S. Cl. ................................ 455/232.1; 455/234.1; 455/234.2; 455/253.2
(58) Field of Search ......................... 455/232.1, 234.1, 455/234.2, 200.1, 250.1, 240.1, 253.2; 330/85, 129

(56) References Cited

U.S. PATENT DOCUMENTS

| | | | | |
|---|---|---|---|---|
| 5,630,220 A | * | 5/1997 | Yano ........................ | 455/234.1 |
| 5,887,246 A | * | 3/1999 | Chevallier et al. ........ | 455/232.1 |
| 6,169,619 B1 | * | 1/2001 | Ide ............................ | 455/234.2 |
| 6,198,830 B1 | * | 3/2001 | Holube et al. ............ | 455/232.1 |
| 6,288,609 B1 | * | 9/2001 | Brueske et al. ........... | 455/234.1 |
| 6,389,272 B1 | * | 5/2002 | Horigome et al. ........ | 455/234.1 |

* cited by examiner

Primary Examiner—Quochien Vuong
Assistant Examiner—Lana Le

(74) Attorney, Agent, or Firm—Steve Mendelsohn; Ian M. Hughes

(57) ABSTRACT

An automatic gain control (AGC) system controls a receiver having multiple amplifier stages with near constant compression. The AGC system controls gain, and thus compression, of each stage employing information generated by the other stages to generate feedback signals at a system level. A central controller uses threshold detection to monitor signal power at each stage of the receiver signal path as well as overall signal gain. Based on these various signal power measurements, the central controller adjusts signal gain of the input to one or more stages, while maintaining overall signal gain for a constant output signal level. The AGC function may be implemented by switching the gain of each stage's variable amplifier in discrete steps in discrete steps, with the step size being coarser for stages closer to the input signal than those closer to the final output baseband signal. Monitoring power of the signal at these points as the signal passes through the series chain of components may also allow for resolution of the desired signal from unwanted interferer signals coincident with the desired signal. Resolution of the desired signal at each stage may further allow for refinement of the gain settings within the receiver. System level feedback may enhance stability and provides the following flexibilities. First, attenuation of the signal as it passes through, for example, the RF/IF receiver is done in discrete steps. Second, the circuit may be relatively easy to implement in integrated circuit (IC) technology. Third, the present invention allows for constant compression, in turn allowing processing of relatively high-level, input signals.

21 Claims, 3 Drawing Sheets

CONSTANT COMPRESSION AUTOMATIC GAIN CONTROL CIRCUIT

BACKGROUND OF THE INVENTION

1. Field of the Invention

The present invention relates to circuits for automatic gain control (AGC) of signals in a telecommunications receiver, and, in particular, constant compression of signals generated within an AGC circuit.

2. Description of the Related Art

Radio and intermediate-radio frequency (RF and IF) transmitters and receivers commonly employ gain control with feedback to adjust signal levels of each amplifier stage. Analog and digital automatic gain control (AGC) circuits are well-known in the art. Although applications in which RF/IF transmitters or receivers with AGC circuits are used are too numerous to describe in detail, one increasingly popular application is in the field of cellular, wireless, and spread-spectrum wireless communication systems.

The AGC function may be employed to bring a newly acquired signal at the input to the receiver into the dynamic range of the receiver when a communication link is first established. Thereafter, the AGC function continually adjusts the overall receiver gain to compensate for fluctuations in received signal strength associated with fading, interference, periods of "silence" between data frames, or similar interruptions of the signal level. The "settling" time of an AGC circuit is the time required by the AGC function to bring the received signal to an optimum level within the dynamic range of the RF receiver. The settling time is typically measured from the time the received signal level first experiences a change in level to the time that the received signal reaches the optimum level.

Such gain control circuitry is primarily employed to maintain a constant level at the output of the series chain of analog components that forms the front end of a receiver, including the amplification and RF/IF demodulation stages. The constant level at the output of the series chain is maintained such that the output (demodulated) baseband signal level of the receiver remains within well-defined limits, even though many factors may vary gain levels within each component of the series chain. For example, in a receiver that delivers audio information to a speaker, the output level of the audio desirably remains constant regardless of 1) variation of the signal level input to the receiver, or 2) variations induced within the receiver components themselves by temperature and/or frequency-dependent influences.

One such influence that occurs is "gain flatness" such that the gain of the circuit component changes as a function of the operating frequency. Most notably, filters often exhibit gain or loss variations across the entire operating frequency range. Another influence is the gain variation across devices manufactured in high volume. Moreover, signal gain (or loss) of these components also varies as ambient temperature changes. The total variation of gain or loss due to frequency variations and/or temperature fluctuations becomes quite large, and possibly out of a specified output level tolerance range, if an AGC function is not implemented within the receiver.

In addition to maintaining a constant signal level output from the series chain of components, the AGC function also adjusts the strength of the signal input to each component along the receiver signal path through the chain. The AGC function adjusts the signal level at points along the path through the chain to an "optimum" level that is within the dynamic range of each of the various components. Each component in the receiver chain has an optimum operating range of signal level, which range is bounded on the lower end by its additive noise characteristics and on the upper end by its saturation point. Thus, physical characteristics of realizable components force trade-offs between competing and contrary requirements that are desirably met simultaneously to achieve overall satisfactory receiver performance.

Therefore, a given receiver design may implement the AGC function having three objectives that are desirably met simultaneously. The first objective is to achieve a relatively constant output level for the baseband signal by varying the output signal of one or more components in the series chain as the level of the signal input to the receiver varies. The second objective is to vary the level of the signal as it passes through the series chain so as to 1) be within the optimum operating range of each component, but 2) not be compressed at any one of the components. The third objective is to keep the level of the signal as it passes through the series chain far enough above the noise floor of each component to maintain a specified signal-to-noise ratio (SNR).

Implementation of the AGC function is further complicated by the fact that these 3 objectives must be met in the presence of interference. The total signal power at any point in the signal path and contains varying proportions of the desired signal power and unwanted signal (interference) power. Consequently, relatively simple implementations for an AGC function may mistake an unwanted signal for the wanted, and then either amplify the unwanted signal or attenuate the wanted signal below recognition (i.e., insufficient SNR for a detector of the demodulated baseband signal). Thus, given these three objectives, the AGC function needs to provide an output signal having an acceptable level of overall signal resolution in the presence of signal interference.

A wide variety of AGC systems for RF/IF transceivers are known in the prior art. These AGC systems include both analog and digital designs, and vary considerably according to speed, accuracy, cost, and complexity. The recent growth of standards for wireless and cellular telecommunication systems, and the accompanying growth in the availability of inexpensive microprocessors to process digital signals, have enabled the implementation of digital or digitally controlled AGC systems. Digital AGC implementations have advantages over comparable analog AGC implementations because digital AGC implementations provide powerful and flexible AGC functionality in dynamic signal and interference environments. These benefits are achieved without additional circuitry that may be required by the comparable analog AGC implementations.

Prior art AGC implementations often employ gain control that is distributed throughout the RF and IF demodulation and gain stages of the receiver as individual AGC circuits. An individual AGC circuit commonly employs either a feed-forward or feed-back AGC signal configuration in which each gain stage detects the signal power at either its input (feed-forward signal configuration) or output (feed-back signal configuration). Based on the detected signal power, each individual AGC circuit adjusts input signal level of the gain stage to maintain a constant level at the output of the gain stage. For these individual AGC circuits, each stage includes an autonomously controlled variable gain amplifier that operates independently of other stages. Such configurations may be unstable since compensation of gain in one stage by an amplifier may produce an overcompensation (or other counter-effect) of the signal for subsequent stages.

In addition, traditional AGC circuits with analog variable-gain amplifiers do not allow for a constant compression-point. The compression-point is a measure of an amplifier's (and, hence, amplifier stage's) linearity. A comparison of the compression point to a particular signal level at the output of the amplifier is related to the "headroom" (or linearity margin) that the stage exhibits for that particular signal level. To avoid amplifier saturation, it is desirable to reduce the level of the desired signal by reducing the amplifier's gain while minimizing a corresponding reduction in the compression point of the amplifier stage. However, for most analog-controlled gain stages of the prior art, reducing the desired signal level by a reduction of gain in the amplifier stage generates a corresponding reduction of compression point. Therefore, high input level (i.e., "strong") signals may require even further gain reduction to maintain signal linearity when the compression point has a corresponding reduction than if the compression point remains constant. While variable gain amplifiers with constant compression point exist within the prior art, they are difficult to implement in, for example, integrated circuits, especially as the operating frequency exceeds 2 gigahertz.

SUMMARY OF THE INVENTION

The present invention relates to an AGC function for a multi-stage receiver that provides each stage, if necessary, with a nearly constant compression point. A central controller uses threshold detection to monitor signal power at each stage of the receiver signal path as well as overall signal gain. The central controller adjusts the gain of signals input to each stage in discrete steps, while maintaining overall signal gain for a constant output signal level. The AGC function may be implemented in, for example, an integrated circuit, by switching the gain of each stage's variable amplifier in discrete steps to adjust signal-to-noise ratio (SNR) and linearity of the signal at each stage to within relatively optimized values. The central controller may determine a gain adjustment for a stage using information from other stages. Monitoring power of the signal at these points as the signal passes through the series chain of components may allow for resolution of the desired signal from unwanted interference signals coincident with the desired signal. Resolution of the desired signal at each stage may further allow for refinement of the gain settings within the receiver.

In an exemplary embodiment of the present invention, an automatic gain control (AGC) function is embodied in, for example, a circuit comprising a series chain of components. The series chain comprises: (1) a first amplifier stage applying a first signal gain to an input signal generate a first gain-controlled signal based on a first AGC signal; (2) a first signal level detector following the first amplifier stage and generating a first signal level value for the first gain-controlled signal; (3) a second amplifier stage following the first signal level detector and applying a second signal gain to the first gain-controlled signal to generate a second gain-controlled signal based on a second AGC signal; and (4) a second signal level detector following the second amplifier stage and generating a second signal level value for the second gain-controlled signal. A controller receives the first and second signal level values and generates the first and second AGC signals. The controller (A) generates an updated first AGC signal based on 1) the second AGC signal and 2) the first and second signal level values; and (B) generates an updated second AGC signal based on 1) the first AGC signal and 2) the first and second signal level values to maintain (i) a level of the second gain-controlled signal within a predefined range and (ii) a nearly constant compression point for the first and second amplifier stages.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
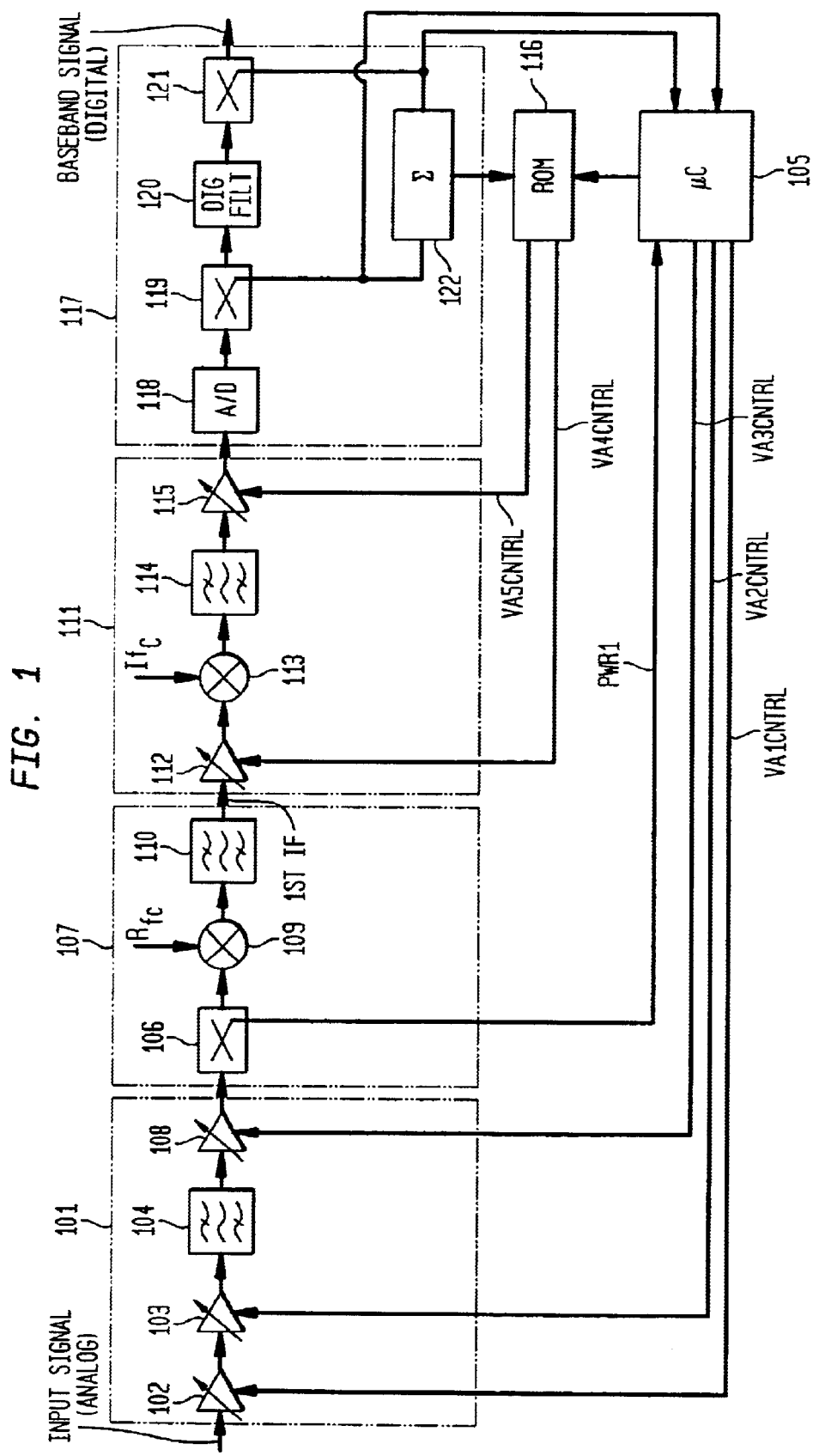
FIG. 1 shows a block diagram of a multi-stage receiver including an exemplary embodiment of an AGC system in accordance with the present invention.

In accordance with exemplary embodiments of the present invention, an automatic gain control (AGC) system for a multi-stage receiver includes a central controller generating AGC signals to control gain or attenuation in each stage while providing a desired, nearly-constant, output signal level. The AGC signals of the central controller allow for overall system stability while each stage exhibits a nearly constant output compression point. Providing for a constant output compression point in each stage may maximize linearity of each stage. Gain settings for each stage are determined by the central controller based on detected signal power and/or signal level at multiple points throughout the signal path passing through the stages of the receiver.

The preferred embodiment of the present invention described herein is with respect to a traditional super-heterodyne receiver, comprising two stages of frequency translation: a radio frequency (RF) stage and an intermediate frequency (IF) stage. Such traditional super-heterodyne receiver may be included in a receiver of a satellite radio system (such as CD-radio) or of a wireless or cellular telecommunications system. Each of the RF and IF stages may further include multiple amplification stages that may be controlled via AGC signals from the central controller, and AGC signals are applied to each stage in the signal path through the receiver. However, the present invention is not limited to super-heterodyne receivers only, but may be employed in any application wherein gain is distributed across diverse functions within a chain of signal processing components. As used herein, "gain" may mean an increase in (amplification of) or decrease in (attenuation of) signal level. In addition, AGC signals might not be generated for each stage, but rather in accordance with gain or attenuation requirements for a particular implementation.

In addition, the preferred embodiment of the present invention described herein employs a central controller providing the AGC function that is implemented in the digital domain with a micro-controller calculating various gain states. Each stage receives an AGC signal generated by the micro-controller from the calculated gain states. The AGC signal may be one of a set of discrete gain values, with each gain value being a digital word generated by the micro-controller. As would be apparent to one skilled in the art, however, the present invention is not limited to microcontroller or microprocessor based systems. The present invention may be extended to any implementation of an AGC system that controls gain of each stage employing information generated by the other stages to generate feedback signals at a system level. For example, a state-machine in combination with a look-up table may be used to generate AGC signals based on detected signal power and/or signal level at multiple points throughout the signal path. In addition, the functions of the various digital circuits may be implemented in whole or in part with analog equivalents.

FIG. 1 shows a block diagram of an RF/IF receiver 100 including an exemplary embodiment of the present invention. An analog, RF modulated signal is applied to RF/IF receiver 100 at a first stage 101 comprising first, second, and third variable gain amplifiers (VGA1, VGA2, and VGA3) 102, 103 and 108, respectively, and RF filter 104. VGA1 102, VGA2 103, VGA3 108 have their gains controlled by respective feedback signals VA1CNTRL, VA2CNTRL, and VA3CNTRL generated by micro-controller 105, as described subsequently. VGA1 102, VGA2 103, and VGA3 108 amplify the RF signal representing a carrier modulated by data prior to down-conversion. RF filter 104 provides some gradual filtering of the amplified signal from VGA2 103 to remove out-of-band interference that is relatively far from the desired operating band.

The filtered signal from RF filter 104 is amplified and down-converted by second stage 107 comprising RF power (PWR) detector 106, RF mixer 109, and RF mixing (MIX) filter 110. RF PWR detector 106 detects a power level of the wideband spectrum that passes through RF filter 104 and VGA2 108, and the detected power level PWR1 is provided to micro-controller 105. The detected power level PWR1 includes 1) the power of the desired signal's frequency spectrum, and 2) any interference power within the spectrum that is approximately 2 to 3 bandwidths (of the desired signal bandwidth) on either side of the desired signal's frequency spectrum.

RF mixer 109 down-converts the input signal to a data modulated carrier signal at first intermediate (carrier) frequency (IF) by mixing with first carrier $Rf_c$ using well-known techniques. The down-converted signal from RF mixer 109 is then filtered by RF MIX filter 110 to remove out-of-band interference, thereby generating the signal $1^{st}$ IF.

In some alternative implementations, RF PWR detector 106 may be placed after RF mixer 109, provided that the frequency translation of mixer 109 is accounted for in calculations by micro-controller 105. In other alternative implementations, RF PWR detector 106 may be placed before VGA3 108, provided that the dynamic range of the RF PWR detector 106 accommodates the range of input signal levels from stage 101. By placing RF PWR detector 106 between VGA3 108 and RF mixer 109, the dynamic range required for RF PWR detector 106 is reduced to the (AGC) dynamic range of VGA3 108.

The signal $1^{st}$ IF is applied to third stage 111 comprising fourth variable gain amplifier (VGA 4) 112, IF mixer 113, IF mixing (MIX) filter 114, and fifth variable gain amplifier (VGA5) 115. VGA4 112 has its gain controlled by a corresponding feedback signal VA4CNTRL and VGA5 115 has its gain controlled by a corresponding feedback signal VA5CNTRL provided from programmable read-only memory (ROM) 116. Values for VA4CNTRL and VA5CNTRL are generated as described subsequently. The signal $1^{st}$ IF from RF mixing filter 110 is amplified by VGA4 112 before being provided to IF mixer 113. IF mixer 113 down-converts the amplified $1^{st}$ IF signal from VGA4 112 by mixing with second carrier $If_c$ using well-known techniques to a data-modulated carrier signal at a second intermediate frequency. The signal from IF mixer 113 is filtered by IF mixing filter 114 to generate the signal $2^{nd}$ IF. The signal $2^{nd}$ IF is amplified by VGA5 115 to generate a signal for detector 117.

Detector 117 comprises analog-to-digital converter (A/D) 118, first power ($1^{st}$ PWR) detector 119, digital filter 120, and second power ($2^{nd}$ PWR) detector 121. A/D 118 converts the analog signal from VGA5 115 into a sequence of digital samples. $1^{st}$ PWR detector 119 detects the power level of the sampled signal from A/D 118, which power level is provided to combiner 122 and micro-controller 105. Digital filter 120 has a frequency characteristic selected so as to filter remaining interference energy from the sampled signal such that the power of the signal applied to $2^{nd}$ PWR detector 121 is substantially the power of the desired signal. $2^{nd}$ PWR detector 121 detects the power level of the filtered, sampled signal provided by digital filter 120, which power level is also provided to combiner 122 and micro-controller 105. Combiner 122 represents a logic block that provides an "either/or" function which combines the detected signals from $1^{st}$ and $2^{nd}$ PWR detectors 119 and 121 into a single value representing the maximum attenuation (or minimum gain) that is needed. For example, if both $1^{st}$ and $2^{nd}$ PWR detectors 119 and 121 indicate attenuation is required, the higher of the two values is used. If one of $1^{st}$ and $2^{nd}$ PWR detectors 119 and 121 indicates added gain is required, while the other indicates attenuation is required, then only the attenuation value is used.

An objective of the AGC function in accordance with the exemplary embodiment is to maintain a constant level for the output from $2^{nd}$ PWR detector 121 corresponding to the sampled, baseband signal that is provided to subsequent stages (not shown) for further processing. In addition, a further objective of the AGC function is to adjust the signal's level as it passes through the series chain of components such that the input level of the signal to each component is within the optimum operating range of the component. The level of the signal is maintained within the optimum operating range of each component so as to 1) not be compressed at any one of the variable amplifiers (i.e., VGA1 102, VGA2 103, VGA3 108, VGA4 112, and VGA5 115) in the receiver; 2) avoid saturation of A/D 118, and 3) maintain the level of the desired signal far enough above the noise floor of each component.

In addition to these objectives, when attenuation may be necessary to maintain a constant level of the desired output signal into baseband circuitry (not shown), preferred embodiments attenuate the desired output signal at a point in the path relatively near to A/D 118 in the series chain. Attenuating the level of the desired signal close to A/D 118 will maintain relatively high overall signal-to-noise (SNR) for the output baseband signal. For example, attenuation applied by VGA1 102, for example, generally has a deleterious affect on overall SNR of the output baseband signal, whereas the same amount of attenuation placed at VGA5 115 has almost no affect on the overall SNR due to the high level of the signal output from VGA5 115. However, relatively small attenuation of the signal passing through the first stage 101, (applied either before or at VGA3 108) may be beneficial in some cases. For example, if the signal level at the input to the receiver stage 101 is high, attenuating the signal with one or more of VGA1 102, VGA2 103 or VGA3 108 may be beneficial to prevent saturation of one or more receiver components. Also, if the signal input to stage 101 has relatively high SNR, then attenuating the signal input to and with one or more of VGA1 102, VGA2 103, or VGA3 108 may also reduce the level of interference signals much earlier in the series chain of components. Therefore, the amount of attenuation applied by each component is also a function of the SNR for the signal input to the first stage 101.

Consequently, AGC signals for exercising gain control in the RF portion of the signal path (e.g., AGC signals for VGA1 102, VGA2 103, and/or VGA3 108) and gain control in the IF portion of the signal path (e.g., AGC signals for VGA4 112 and/or VGA5 115) are inversely related to maintain constant output level. Changes to gain in the RF portion of the signal path are offset by changes to gain in the IF portion of the signal path by AGC signals from micro-controller 105. Micro-controller 105 uses a look-up table stored in ROM 116 to control overall system gain across stages 101, 107 and 111 by causing ROM 116 to output table entries as control signals VA4CNTRL and VA5CNTRL. Micro-controller 105 effects an offset in the gain of the third (i.e., the IF) stage 111 in the opposite direction of the gain of the first and second (i.e., the RF) stages 101 and 107, respectively, thereby maintaining the overall system gain constant.

The output value PWR1 from (analog) RF PWR detector 106 is evaluated by micro-controller 105. Based on this evaluation, micro-controller 105 generates feedback AGC signals VA1CNTRL, VA2CNTRL, and VA3CNTRL to control the gain of respective variable amplifiers VGA1 102, VGA2 103, and VGA3 107. Then, the greater value generated by (digital) $1^{st}$ and $2^{nd}$ PWR detectors 119 and 121 is used by micro-controller 105 to select a value of a look-up table stored in ROM 116. Micro-controller 105 determines the correct values for feedback AGC signals VA4CNTRL and VA5CNTRL that are applied to variable amplifiers VGA4 112 and VGA5 115, respectively, from the value provided from the look-up table stored in ROM 116.

Generation of AGC feedback signals by micro-controller 105 to variable amplifiers VGA1 102, VGA2 103, VGA3 108, VGA4 112, and VGA5 115 is now described. Micro-controller 105 uses signal level (power level) information of each of the stages 101, 107, and 111 (termed herein "system level feedback"). to set gain or attenuation of the signal as it passes through the receiver 100 using discrete amplitude steps. Relatively large discrete steps or increments, such as 0, ±15, ±30 dB increments, may be employed for variable amplifiers VGA1 102, VGA2 103, VGA3 108 of (RF) stages 101 and 107. Relatively small discrete steps (e.g., ±1 dB) may be employed for adjusting the gain of variable amplifiers VGA4 112 and VGA5 115 of the (IF) stage 111.

Maintaining a limited and relatively narrow range of signal level for the signal applied to the A/D 118 may assure a nearly constant baseband signal level at the output of $2^{nd}$ PWR detector 121 since A/D 118 is the last analogue component in the series chain. To maintain this range, a relatively simple implementation of the AGC function by micro-controller 105 reads the signal level detected by $2^{nd}$ PWR detector 121. Micro-controller 105 then adds attenuation by addressing values in look-up table in ROM 116 provided to VGA5 115 via AGC signal VA5CNTRL to bring an excessive signal level into range. Once the attenuation range of VGA5 115 is exhausted, attenuation is added with VGA4 112 via AGC signal VA4CNTRL. Once the range of 112 is exhausted, attenuation is added with VGA3 108 via AGC signal VA3CNTRL, and so on. This relatively simple implementation of the AGC function maintains signal level and SNR simultaneously, but might not account for power of signal components input to A/D 118 that are filtered out by digital filter 120. These signal components may saturate the A/D 118 and cause distortion, but would not be detected or adjusted for by this relatively simple implementation of the AGC function. Thus, $1^{st}$ PWR detector 119 is employed to measure the signal level applied to A/D 118 and is used as an A/D "overload" detector. If $1^{st}$ PWR detector 119 detects an A/D overload, the detected levels of $1^{st}$ and $2^{nd}$ PWR detectors 119 and 121 are applied to combiner 122. Combiner 122 generates a signal that adjusts the value provided to VGA4 112 and VGA5 115 from the look up table in ROM 116 based on the combined, detected signal levels. Thus, the signal from combiner 122 adds some additional attenuation in the IF portion of the signal path to the attenuation initially derived from the level detected by $2^{nd}$ PWR detector 121.

Gain variation at a system level across all stages 101, 107, and 111 creates uncertainty in the AGC function implemented by, for example, micro-controller 105 when identifying the precise cause for a change in signal level at the input of A/D 118. For example, the case of increasing receiver gains and the case of increasing input signal level are generally indistinguishable when monitoring the signal level at the input of the A/D 118 (via output of either $1^{st}$ and $2^{nd}$ PWR detectors 119 and 121). However, micro-controller 105 generates different AGC signals for these two cases.

For the first case in which the receiver gains of the first stage 101 are increasing (e.g., increasing gains of VGA1 102 and VGA2 103), but the received signal level remains relatively constant, attenuation is added in third stage 111 so as to maintain SNR of the signal applied to A/D 118. For the first case, adding attenuation in components later in the series chain preserves overall SNR. For the second case of a steadily increasing signal level, attenuation is added in either or both of the first and second stages 101 and 107 (via gain control of VGA1 102, VGA2 103, and/or VGA3 108) to avoid saturation of stage 107 (and all subsequent stages). However, a similar receiver configuration that generates AGC feedback signals at a system level without signal power detection prior to $2^{nd}$ PWR detector 121 would not know why the signal level is increasing at the A/D 118. Without signal power detection in the signal path before the A/D 118, an AGC function would assume that gains are increasing and, therefore, SNR of the signal input to A/D 118 should be preserved at the expense of linearity.

In the preferred embodiment, the signal power is also measured by RF PWR detector 106, allowing micro-controller 105 to determine whether 1) the case of increasing receiver gains or 2) the case of increasing input signal level is present. Thus, micro-controller 105 may determine where attenuation should be added in the signal path to optimize the overall gain of the receiver 100. Implementations of AGC systems employing RF signal power detection by, for example, RF PWR detector 106 in the RF portion of the signal path may preserve linearity, and hence provide a nearly constant compression point for the signal output from each component along the signal path.

RF PWR detector 106 may also allow for the detection by micro-controller 105 of interferer signals (i.e., carrier signals modulated by data of other users), which may not necessarily be possible at later stages (such as before an A/D converter). The interferer signal may not necessarily be detected because the interferer signal may be suppressed by the narrow IF filtering with IF MIX filter 114 (which may be, e.g., an IF surface acoustic wave (SAW) filter). When an interferer signal is detected by micro-controller 105 based on the output PWR1 of RF PWR detector 106, attenuation may be added by micro-controller 105 with the AGC signal VA3CNTRL applied to VGA3 108 to suppress the interferer signal while maintaining signal linearity.

Micro-controller 105 generates feedback AGC signals under two conditions: initial start-up conditions and steady-state conditions. Initial start-up conditions exist when, for example, the circuit is turned on with an unknown input signal level (at stage 101) and unknown gain conditions exist within both the RF and IF portions of the signal path. Steady-state conditions are present in the circuit after the initial start-up conditions and one characterized by low gain uncertainty.

Figure 2:
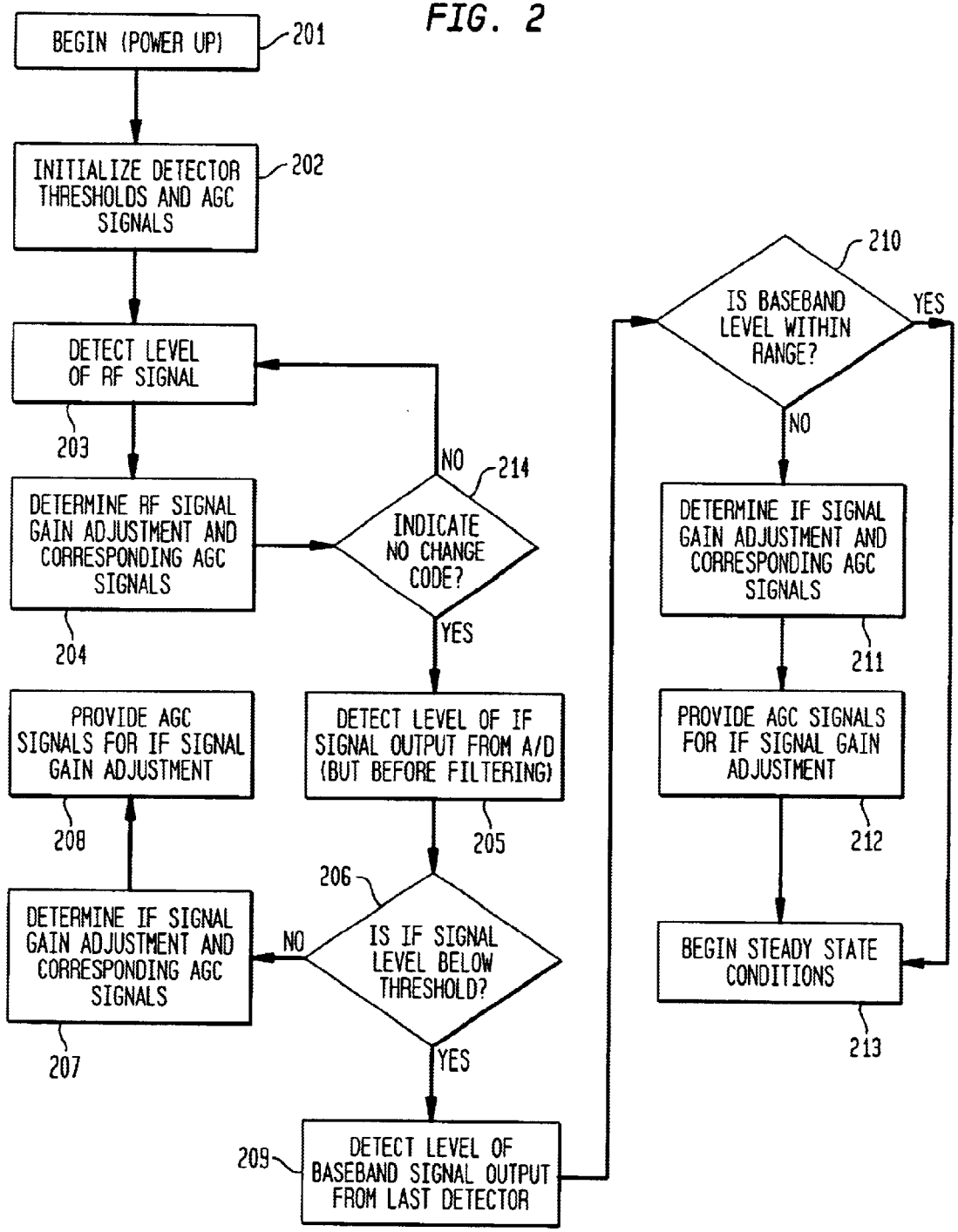
FIG. 2 shows steps of an exemplary method or program employed by a central controller for the exemplary embodiment of the receiver shown in FIG. 1 for initial signal conditions.

Before the steady-state conditions are reached, such as during acquisition from a powered-down state, the receiver 100 may implement the steps shown in FIG. 2 to generate feedback AGC signals to reach steady-state conditions. As shown in FIG. 2, the method begins at step 201, with a "power on" of the receiver and AGC system. At step 202, the power detectors, which may be implementations of RF PWR detector 106 and $1^{st}$ and $2^{nd}$ PWR detectors 119 and 121 that incorporate threshold detection, are initialized with start-up comparison threshold values. Start-up values may either be default values, or predetermined values estimated from previous operating values.

For the described exemplary embodiment, threshold detection generates a comparison of a detected power level (voltage) to a preset voltage to give a binary value representing the detected level (e.g., for PWR1). RF PWR detector 106 may be implemented using two threshold detectors with two different thresholds gives a 2-bit binary-valued indication, and such detector is known in the art as a "window detector". Guidelines for selecting these thresholds are described subsequently. A truth table corresponding to this 2-bit binary-valued indication for RF PWR detector 106 is shown in Table 1:

TABLE 1

| High Detector Bit | Low Detector Bit | Reaction |
| --- | --- | --- |
| 0 | 0 | Increase Gain |
| 0 | 1 | No Change |
| 1 | 1 | Reduce Gain |
| 1 | 0 | Not Valid |

At step 203, micro-controller 105 reads the detected signal power level of the RF portion of the signal path (the "RF signal") from RF PWR detector 106. At step 204, micro-controller 105 determines a course gain adjustment applied to one or more of VGA1 101, VGA2 102, and VGA3 108 based on the binary-valued indication from RF PWR detector 106. Valid gain adjustments (gain transitions) for VGA1 102, VGA2 103, and VGA3 108 are as given in Table 2.

TABLE 2

| State | VGA1 | VGA2 | VGA3 |
| --- | --- | --- | --- |
| 1 | ON | ON | Full Gain |
| 2 | ON | ON | Half Gain |
| 3 | ON | ON | Full Attenuation |
| 4 | ON | OFF | Half Gain |
| 5 | OFF | OFF | Full Gain |
| 6 | OFF | OFF | Half Gain |
| 7 | OFF | OFF | Full Attenuation |

Increasing gain requires a transition from a lower state to a higher one, and for decreasing gain the reverse direction is required. At step 214, a test determines if the output PWR1 of RF PWR detector 106 indicates a '01' code (no change). If the test of step 214 determines that the output PWR1 indicates a change, then the method returns to step 203. Steps 203 and 204 are repeated until the RF PWR detector 106 indicates a '01' code (no change), at which point the signal level of the RF signal is within a predefined range. If the test of step 214 determines that the output PWR1 indicates a change, then the method advances to step 205.

At step 205, micro-controller 105 reads the detected level of signal power generated by $1^{st}$ PWR detector 119. At step 206, a test determines if the detected power level at $1^{st}$ PWR detector 119 of the IF portion of the signal path (the "IF signal") input to A/D 118 is at or above a threshold signal power level that may, or does, saturate A/D 118. If the test of step 206 determines that the IF signal level is at or above the threshold, at step 207, the micro-controller 105 determines a gain adjustment for the IF signal. At step 208, the micro-controller 105 applies the gain adjustment of the IF signal via either or both of feedback AGC signals VA4CNTRL and VA5CNTRL that are provided to corresponding variable gain amplifiers VGA4 112 and VGA5 115. From step 208, the method returns to step 205. When the test of step 206 determines that the signal level is below the threshold, the method proceeds to step 209.

At step 209, micro-controller 105 reads the detected signal power level of $2^{nd}$ PWR detector 121. At step 210, a test determines whether the detected signal power level is within a predetermined, desired range for the output baseband signal. If the test of step 210 determines that the detected signal power level is outside of the predetermined, desired range, at step 211 the micro-controller 105 determines a gain adjustment of the IF signal. At step 212 the micro-controller 105 applies the gain adjustment to the IF signal via either or both of feedback AGC signals VA4CNTRL and VA5CNTRL to bring the detected signal power level within the desired range. From step 212, the method proceeds to step 213 which implements the AGC function for steady-state conditions as described subsequently with respect to FIG. 3. Although FIG. 2 shows a single iteration for gain adjustment at steps 209–212, alternate embodiments may implement an iterative loop by applying a preset gain adjustment at step 212 and then returning to step 209. If the test of step 210 determines that the detected signal power level is within the predetermined, desired range, the method proceeds to step 213 to the routine employed by micro-controller 105 to implement a system level AGC function under steady-state conditions.

Gain adjustment of the IF signal via either or both of feedback AGC signals VA4CNTRL and VA5CNTRL is implemented by the micro-controller 105 by providing discrete gain step values to corresponding variable gain amplifiers VGA4 112 and VGA5 115 from ROM 116. ROM 116 contains the pre-determined gain step values (or corresponding amplifier control signal commands) associated with the particular gain states that are implemented. Alternatively, the micro-controller 105 may compute the gain step values and apply the command bits directly to VGA4 112 and VGA5 115 as feedback AGC signals VA4CNTRL and VA5CNTRL without the use of ROM 116. In addition, each gain step value may be a relatively small step (e.g., ±1 dB, ±5 dB) applied during a single clock cycle. To effect a particular amount of gain change, the feedback AGC signal for the corresponding amplifier may apply a gain step over several clock cycles. For example, to effect a particular gain change of 3 dB to VGA5 115, the feedback AGC signal VA5CNTRL may apply the step of 1 dB over three clock cycles.

Figure 3:
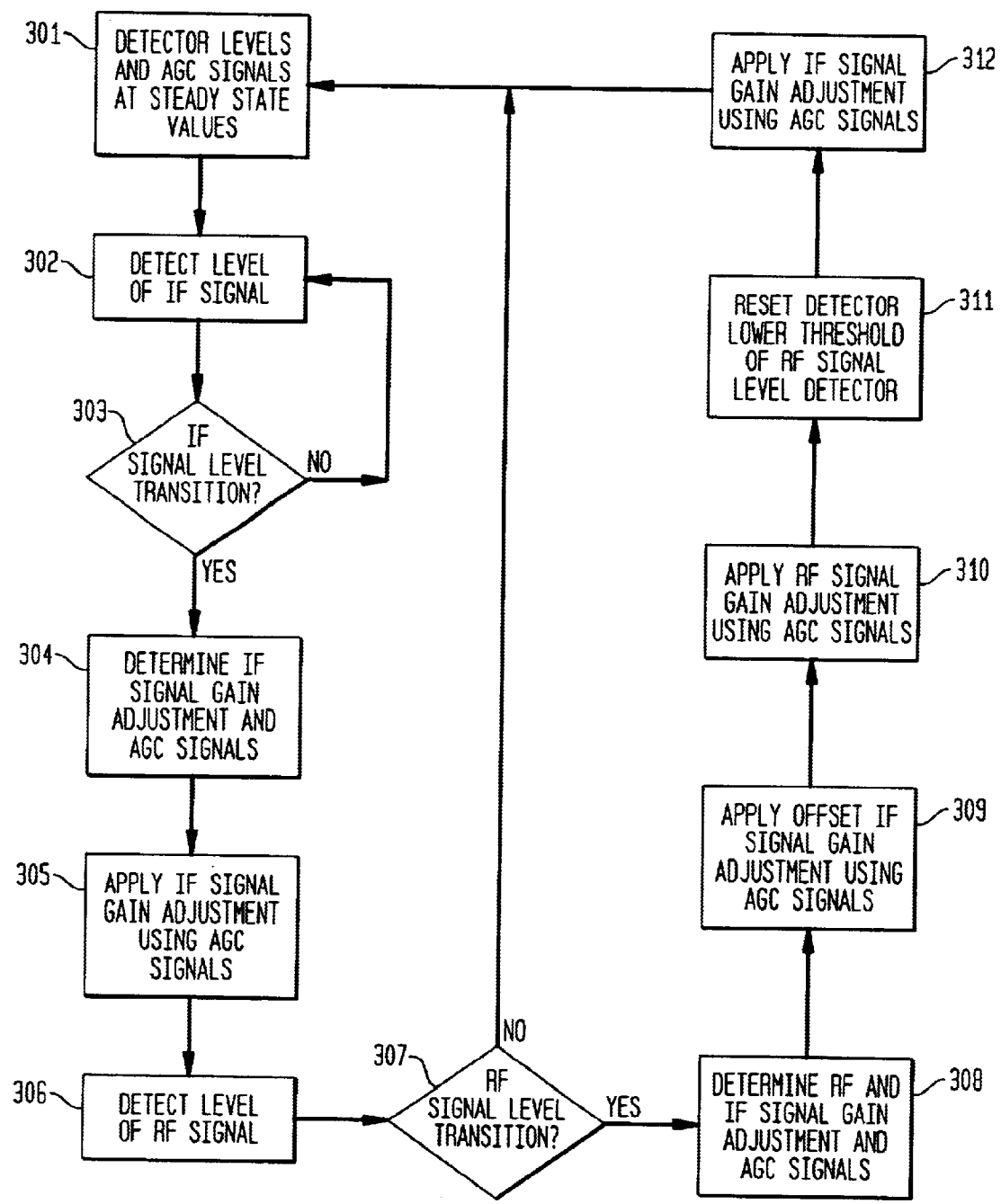
FIG. 3 shows steps of an exemplary method or program employed by a central controller for the exemplary embodiment of the receiver shown in FIG. 1 for steady-state signal conditions.

For steady-state conditions of AGC feedback and signal gain, relatively small changes in signal level are observed in the baseband signal as detected by micro-controller 105 from output level values of 1$^{st}$ and 2$^{nd}$ PWR detectors 119 and 121. These relatively small changes are compensated for by corresponding changes to the gain of VGA4 112 and/or VGA5 115 applied to the IF signal. The signal gain of VGA4 112 and/or VGA5 115 may be changed using pre-defined increments. These pre-defined increments may be smaller than those used, for example, when implementing the method of FIG. 2 for initial conditions, and these increments may be selected based on the step size of power adjustments tolerable to the baseband circuitry (not shown) of receiver 100. However, the incremental changes are suspended by micro-controller 105 when the power level measured by RF PWR detector 106 indicates a need for gain adjustment of the RF signal. FIG. 3 shows steps of an exemplary method or program employed by micro-controller 105 to implement system level AGC function under steady-state conditions.

At step 301, the feedback AGC signals VA1CNTRL, VA2CNTRL, VA3CNTRL, VA4CNTRL, and VA5CNTRL for the receiver 100 are in their initial steady-state values as determined by implementing, for example, the steps of FIG. 2. Micro-controller 105 provides VGA1 101, and VGA2 102, and VGA3 108 corresponding feedback AGC signals VA1CNTRL, VA2CNTRL, and VA3CNTRL to maintain the gain of the RF signal. VGA4 112 and VGA5 115 receive corresponding feedback AGC signals VA4CNTRL and VA5CNTRL to maintain the gain of the IF signal.

At step 302, power levels for the baseband signal level at the outputs of 1$^{st}$ and 2$^{nd}$ PWR detectors 119 and 121 are detected. At step 303, a test (by, e.g., either a micro-controller 105 or separate a IF signal transition detector) determines whether a level transition has occurred for the IF signal based on the detected power levels of the baseband signal level. If the test of step 303 determines that no level transition has occurred, the method returns to step 302.

If the test of step 303 determines that a level transition has occurred, at step 304, micro-controller 105 determines the amount of adjustment for the level transition, as well as the increment step size(s) and the number/frequency of the increments for the adjustment. If the detected level transition is relatively small, a few relatively large increments for gain.adjustment of the IF signal may be preferred. If the detected level transition is relatively large, a large number of relatively small increments for gain adjustment may be preferred. Since the various types of increment step size are themselves pre-determined and stored in one or more look-up tables in ROM 116, at step 304, micro-controller 105 may select which type of increment step size is provided from the ROM 116.

Once the increments are selected, at step 305 the gain adjustment is applied to the IF signal by VGA4 112 and VGA5 115 via feedback AGC signals VA4CNTRL, and VA5CNTRL. If the test of step 303 determines that the gain transition indicates a small change, a few relative large increments for gain adjustment of the IF signal are provided to VGA4 112 and VGA5 115 at step 305. If the test of step 303 determines that the change in signal indicates a relatively large transition, a larger number of relatively small increments for gain adjustment are provided to VGA4 112 and VGA5 115 at step 305. For one implementation of the present invention, the increments are provided from look-up table of ROM 116 using addresses generated from combiner 122. Combiner 122 uses values of signal power observed in the baseband signal by 1$^{st}$ and 2$^{nd}$ PWR detectors 119 and 121 to form each address, such as by employing the sum of the values as an offset from a base address.

At step 306, micro-controller 105 detects the level of the RF signal using the output value of RF PWR detector 106.

At step 307, a test determines whether the level detected in step 306 indicates a level transition in the RF signal. If the test of step 307 determines that no level transition has occurred (and, hence, no gain adjustment should be applied), the method returns to step 301. If the test of step 307 determines that gain adjustment should be applied to the RF signal to compensate for the level transition, at step 308, the amount of gain adjustment (i.e., the increment step size and frequency) is determined for both the RF and IF signals. Gain adjustment may be required for the IF signal (via feedback AGC signals VA4CNTRL and VA5CNTRL) prior to applying a gain adjustment to the RF signal (via feedback AGC signals VA1CNTRL, VA1CNTRL, and VA3CNTRL) to prevent large gain increases in the RF signal that may saturate downstream components or feedback loop instability (for example, saturate A/D 118).

The anticipated gain adjustment of the IF signal is determined at step 308 for the following reasons. The exact RF AGC gain steps of VGA1 101, VGA2 102, and VGA3 108 may not be known precisely a priori. Errors in the gain step, if not accounted for, may be misconstrued by the AGC function as a change in the received signal level, which may thus cause instability in the system level AGC control loop. For example, if the RF AGC gain step is 10 dB with an error of +/−2 dB and the actual applied gain step is 12 dB instead of 10 dB, the level of the baseband signal measured at the output will increase by 12 dB. This 12 dB increase may be interpreted to be from 10 dB of additional RF AGC gain step and 2 dB of increased input signal level to the first stage. Consequently, the AGC function may try to compensate for the perceived 2-dB increase in "received" signal level, resulting in an unstable system. Thus, anticipated gain adjustment of the IF signal at VGA4 112 and VGA5 115 is set such that the anticipated gain adjustment reduces the IF signal by the maximum amount of gain plus any gain step error that may be applied to the RF signal. Thus, applying the anticipated gain adjustment results in the IF signal that might require at least some further amplification once the gain adjustment is applied at VGA1 101, VGA2 102, and VGA3 108.

Returning to FIG. 3, from step 308, the method proceeds to step 309. At step 309, feedback AGC signals VA4CNTRL and VA5CNTRL are applied to VGA4 112 and VGA5 115 to increase or decrease gain in anticipation of the gain adjustment to the RF signal. At step 310, feedback AGC signals VA1CNTRL, VA2CNTRL, and VA3CNTRL are applied to corresponding VGA1, VGA2, and VGA3 so as to affect the determined gain adjustment to the RF signal. Steps 309 and 310 may occur nearly simultaneously to minimize settling time of the receiver. At step 311, the micro-controller 105 resets the lower threshold of the RF PWR detector 106, if necessary. At step 312, any RF errors and residual IF gain offset errors are removed through use of detectors 119 and 121 in a manner similar to that performed in steps 304 and 305. After step 312, the method returns to step 302.

RF PWR detector 106 may employ upper and lower bounds for the level range of the RF signal to implement a window detector as previously discussed. Guidelines for selecting these thresholds are now described for the preferred embodiment. However, one skilled in the art would recognize that these guidelines may be modified for alternative embodiments depending upon the particular number, order, and configuration of RF and IF feedback AGC signals employed.

Applying the gain adjustment to the RF signal via the RF AGC gain step(s) previously discussed limits the input signal power to RF MIX 109 to a predetermined power level as determined by the realizable dynamic range of the RF MIX 109. This power level may be considered the reference point that is substantially equal to the upper threshold value of RF PWR detector 106. When the RF signal power level reaches this reference point, the maximum tolerable power level of the receiver is thus reached, and the AGC function then increases attenuation of the RF signal.

The value for the lower threshold of RF PWR detector 106 is variable and is determined at any given time by the present gain state of the feedback AGC signals applied to the RF signal. The lower threshold value ($TH_l$) equals the upper threshold value ($TH_u$) minus i) the gain step between the next higher gain state and the present one (i.e., either $GS_{i,i+1}$ or GS $GS_{i+1,i}$ depending on gain step direction); and minus ii) the gain step error ($GS_{err}$). For example, if the RF AGC is set in gain state 4, the value $GS_{3,4}$ of the gain step between state 3 and state 4 is used. Then, the lower threshold $TH_l$ is equal to the upper threshold $TH_u$ minus $GS_{3,4}$ and minus $GS_{err}$ (the state 3 to state 4 gain step error). The addition of the gain step error to the lower threshold value calculation assures enough hysteresis in the AGC function (AGC control loop(s)) to provide feedback stability.

For a typical implementation of the preferred embodiment, detection and/or decoding of the baseband signal may set bounds for error in overall signal gain due to errors introduced by gain transitions in response to the feedback AGC signals. For the previously described gain transitions associated with feedback AGC signals VA1CNTRL, VA2CNTRL, and VA3CNTRL applied to the RF signal, the greatest gain step error for the exemplary implementation may be ±4 dB (8 dB peak-to-peak (p-p)). A total error bound of ±5 dB (10 dB p-p) may be set as a bound for the detecting and/or decoding of the baseband signal. Consequently, the remaining ±1 dB gain step error may be associated with gain transitions applied to the IF signal (i.e., feedback AGC signals VA4CNTRL and VA5CNTRL for VGA4 112 and VGA5 115, respectively). Table 3 summarizes these transition, and hence gain, error budget for gain transitions applied to the RF and IF signals.

TABLE 3

| RF VGA1 + VGA2 | RF VGA3 | IF VGA4 + VGA5 | Max (p-p) | Units |
|---|---|---|---|---|
| 4 | 4 | 2 | 10 | dB |

For the preferred embodiments of the present invention, the AGC function generates feedback AGC signals that are monotonically increasing or decreasing, which characteristic may be maintained by implementing the following guidelines. First, the error in any incremental change in gain should be less than the increment, or gain step, size. Second, the gain step error generated for transitions between any two states should be less than the error budget, which is less than ±5 dB total for the described exemplary embodiment. Third, for an iterative or recursive method implementing the AGC function (such as shown in FIG. 3) that is operating under steady-state conditions, any error resulting from an applied change in gain in the RF and IF signals during one iteration should be corrected during the next iteration. Provided the gain error budget is met, performance of a receiver is not compromised after a gain transition, but the nominal receiver operating point is reestablished after each iteration during the next iteration, whereupon a final gain adjustment is made within the IF gain to re-optimize the level of the output baseband signal.

The following exemplary case illustrates the guidelines for monotonicity for an increasing signal. Given a signal increases by an incremental amount above the upper threshold of the RF detector 106, assume that the micro-controller 105 determines that i) RF signal gain be reduced by 20 dB, and ii) the IF signal gain be increased by 19 dB, yielding a net decrease of 1 dB of baseband signal level. However, the gain step error in the RF signal gain step is 2 dB (specified), with a 1.5-dB step error actually applied. The gain step error in the IF signal is 1.0 dB (specified) with a 1.0-dB step error actually applied. Therefore, in the first iteration, the IF gain is increased by 19+3 dB for 22-dB total increase in signal level, while the RF gain is reduced by 18.5 dB actual for a net increase of 3.5 dB in signal level. In the next iteration, the IF gain is further reduced by 4 dB. The monotonicity is guaranteed as long as the IF gain overcompensates for the actual gain step error corresponding to the current gain step.

An AGC system operating in accordance with an exemplary embodiment of the present invention may have the following advantages. The AGC system ensures that the receiver provides a near constant signal level to the A/D that is maintained in the presence of slowly varying signal and gain conditions. Slowly varying signal and gain conditions may be: 1) manufacturing, temperature, and/or frequency dependent gain variations in the receiver's integrated circuit (IC) including filters, matching components, variable amplifiers, and interconnecting cables; 2) installation length variations of interconnecting cables that translate into fixed manufacturing gain variations; and 3) received signal level variations, which are usually due to variations in the distance between the receiver and the transmitter, antenna reception angle, physical absorbers in path, and multi-path signal components. In addition, multi-point detection of the spectral energy of the signal passing through the receiver chain allows resolution of the desired signal from any unwanted interferer signals that are coincident with the desired signal through portions of the receiver. This allows further refinement of the gain settings within the receiver wherein an optimum decision on gain can be made to attenuate interference without detriment to the desired signal. The AGC system may increase the receiver's immunity to an interferer signal by attenuating the interferer signal below a level harmful to the receiver. This technique may be most successful when attenuation is exercised so as to minimize SNR degradation on the wanted signal by using known characteristics of interferer signal types.

The AGC function may be implemented in, for example, an integrated circuit, by switching the gain of each stage's variable amplifier in discrete steps or by switching the attenuation in discrete steps of the signal input to the stage's fixed gain amplifier. These advantages of the present invention allow for a relatively simple, and, thus, inexpensive, AGC implementation within an IC.

While the exemplary embodiments of the present invention have been described with respect to circuits and systems, the present invention is not so limited. As would be apparent to one skilled in the art, various functions may be implemented in the digital domain as processing steps in a software program, by digital logic, or in combination of both software and hardware. Such software may be employed in, for example, a digital signal processor, micro-controller or general-purpose computer. Such hardware and software may be embodied within circuits implemented in an integrated circuit.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An automatic gain control (AGC) circuit comprising:
    a series chain of components, the series chain comprising:
    (1) a first amplifier stage applying a first signal gain to an input signal generate a first gain-controlled signal based on a first AGC signal;
    (2) a first signal level detector following the first amplifier stage and generating a first signal level value for the first gain-controlled signal;
    (3) a second amplifier stage following the first signal level detector and applying a second signal gain to the first gain-controlled signal to generate a second gain-controlled signal based on a second AGC signal; and
    (4) a second signal level detector following the second amplifier stage and generating a second signal level value for the second gain-controlled signal; and
    a controller receiving the first and second signal level values and generating the first and second AGC signals, wherein:
        the controller (A) generates an updated first AGC signal based on 1) the second AGC signal and 2) the first and second signal level values; and (B) generates an updated second AGC signal based on 1) the first AGC signal and 2) the first and second signal level values to maintain (i) a level of the second gain-controlled signal within a predefined range and (ii) a nearly constant compression point for the first and second amplifier stages.

2. The invention as recited in claim 1, wherein the first amplifier stage comprises:
    a first variable amplifier adjusting the gain of the input signal based on the first AGC signal, and
    wherein the first signal level detector comprises a window detector generating the first signal level, the window detector comparing the input signal with lower and upper threshold values.

3. The invention as recited in claim 2, wherein the upper threshold is based on the predefined range for the level of the output signal, and the lower threshold is set by the controller based on a current gain setting of the first AGC signal.

4. The invention as recited in claim 2, wherein the first amplifier stage further comprises an input mixer, the input mixer translating the input signal having an input frequency spectrum centered about an input carrier to a the frequency spectrum centered about the first carrier.

5. The invention as recited in claim 1, wherein the second amplifier stage comprises:
    a second variable amplifier adjusting the gain applied to the gain controlled input signal based on the second AGC signal; and
    an intermediate mixer translating the frequency spectrum of the gain-controlled input signal centered about the first carrier to the frequency spectrum centered about the second carrier.

6. The invention as recited in claim 5, wherein the controller provides the second AGC signal as a discrete-valued gain step from a memory, the level of the output signal from the second signal level detector applied to the memory to form the address in the memory for the discrete valued gain step.

7. The invention as recited in claim 1, wherein the second signal level detector includes a converter-saturation detector comparing a level of the signal input to the converter to a threshold to generate a saturation signal, and the controller adjusts one or more of the first and second AGC signals to reduce the intermediate signal based on the saturation signal.

8. The invention as recited in claim 1, wherein the first and second AGC signals are each generated as one or more discrete-valued gain steps, the one or more discrete-valued gain steps for the first AGC signal being relatively coarser than the one or more discrete-valued gain steps for the second AGC signal.

9. The invention as recited in claim 1, wherein the AGC circuit is embodied in an integrated circuit.

10. The invention as recited in claim 1, wherein the AGC circuit is implemented in a transceiver of a satellite radio, wireless or cellular communication system.

11. A method of automatic gain control of a signal comprising the steps of:
    (a) applying a first signal gain to an input signal to generate a first gain-controlled signal based on a first AGC signal;
    (b) generating a first signal level value for the first gain-controlled signal;
    (c) applying a second signal gain to generate a second gain-controlled signal based on a second AGC signal; and
    (d) generating a second signal level value for the second gain-controlled signal; and
    (e) generating updated first and second AGC signals from the first and second signal levels, wherein:
        (A) the updated first AGC signal is generated based on 1) the second AGC signal and 2) the first and second signal level values; and (B) the updated second AGC signal is generated based on 1) the first AGC signal and 2) the first and second signal level values to maintain (i) a level of the second gain-controlled signal within a predefined range and (ii) a nearly constant compression point for the first and second amplifier stages.

12. The invention as recited in claim 11, wherein step (b) generates the first signal level with a window detector by the step of (b1) comparing the input signal with lower and upper threshold values.

13. The invention as recited in claim 12, wherein the upper threshold is based on the predefined range for the level of the output signal, and the lower threshold is set based on a current gain setting of the first AGC signal.

14. The invention as recited in claim 12, wherein step (a) further comprises the step of translating, with a mixer, the input signal having an input frequency spectrum centered about an input carrier to a the frequency spectrum centered about the first carrier.

15. The invention as recited in claim 11, wherein step (c) further comprises step of (c1) translating, with a mixer, the frequency spectrum of the first gain-controlled input signal centered about the first carrier to the frequency spectrum centered about the second carrier.

16. The invention as recited in claim 15, wherein step (e) includes the steps of (e1) generating the updated second AGC signal as a discrete-valued gain step from a memory, and (e2) applying the second signal level to the memory to form the address in the memory for the discrete valued gain step.

17. The invention as recited in claim 11, wherein step (d) further includes the steps comparing a level of the second gain-controlled signal to a threshold to generate a saturation signal, and adjusting one or more of the first and second AGC signals to reduce the second gain-controlled signal based on the saturation signal.

18. The invention as recited in claim 11, wherein the first and second AGC signals are each generated as one or more discrete-valued gain steps, the one or more discrete-valued gain steps for the first AGC signal being relatively coarser than the one or more discrete-valued gain steps for the second AGC signal.

19. The invention as recited in claim 11, wherein the method is implemented by a processor embodied in an integrated circuit.

20. The invention as recited in claim 11, wherein the method is implemented by a processor in a transceiver of a wireless or cellular communication system.

21. A computer-readable medium having stored thereon a plurality of instructions, the plurality of instructions including instructions which, when executed by a processor, cause the processor to implement a method for automatic gain control, the method comprising the steps of:

(a) applying a first signal gain to an input signal to generate a first gain-controlled signal based on a first AGC signal;

(b) generating a first signal level value for the first gain-controlled signal;

(c) applying a second signal gain to generate a second gain-controlled signal based on a second AGC signal; and (d) generating a second signal level value for the second gain-controlled signal; and (e) generating updated first and second AGC signals from the first and second signal levels, wherein:

(A) the updated first AGC signal is generated based on 1) the second AGC signal and 2) the first and second signal level values; and (B) the updated second AGC signal is generated based on 1) the first AGC signal and 2) the first and second signal level values to maintain (i) a level of the second gain-controlled signal within a predefined range and (ii) a nearly constant compression point for the first and second amplifier stages.

* * * * *